CIRCUIT BOARDS

Filed Aug. 27, 1958

INVENTOR.
ROBERT BROWNFIELD.
BY
Harry H. Hitzeman
ATTORNEY.

United States Patent Office 3,079,577
Patented Feb. 26, 1963

3,079,577
CIRCUIT BOARDS
Robert Brownfield, 143 S. Westmore St., Lombard, Ill.
Filed Aug. 27, 1958, Ser. No. 757,625
2 Claims. (Cl. 339—17)

My invention relates to novel circuit boards and more particularly relates to circuit boards having an insulating panel, a conductor with exposed portions for connecting electrical component leads, and connecting means at the exposed portions to grip and engage the leads.

An object of the invention is to provide an improved circuit or panel board for use with electrical components in which the conductor has portions for connection of electrical components, which portions have a central opening smaller in size than the component leads, slots extending outwardly from the opening, finger portions adjacent the slots, and intersecting edges on the fingers to engage and grip the lead.

A further object of the invention is to provide a circuit board of the type described having embossed and slit contact areas on the conductor whereby the lead introduced therein is held locked against withdrawal from the circuit.

A further object of the invention is to provide an improved circuit board with a conductor supported by an insulating panel, which board requires no solder or welding of the leads, and one which is easily and cheaply made and cannot become broken or out of order during its use.

Other objects and advantages will be more apparent from the following description wherein reference is had to the accompanying drawings, upon which:

Figure 3:
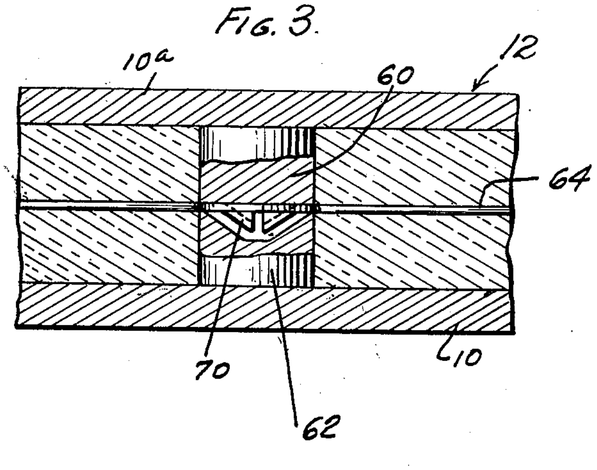
FIG. 3 is a fragmentary cross-sectional view showing how a panel board embodying this type of construction may be made.

In producing a circuit board, I use, for example, a mold pan 10 (FIG. 3) and pour the plastic into the same to produce an insulating panel 12, after the flat metal conductors 64 have been laid about and placed on the cylindrical extensions 62 of pan 10 and after the inverted top mold pan 10*a* is in place with cylindrical shell members 60 aligned with extensions 62 and discs 66 of conductors 64. The conductors 64 form a circuit and are supported by panel 12. The cylindrical shell members 60 provide openings in the panel where electrical component leads can be connected to the locking sockets of the conductors.

Figure 1:
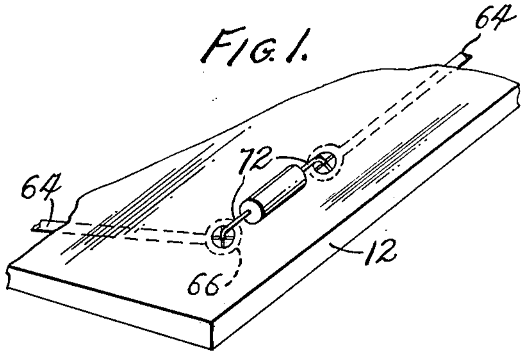
FIG. 1 is a fragmentary view of my circuit board, showing an electrical component secured and connected to the conductor.
Figure 2:
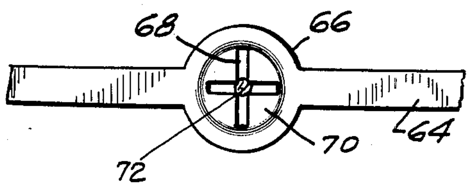
FIG. 2 is a plan view of the preferred form of locking socket of the flat metal conductor.

Each locking socket may be in the form of a disc 66 (FIGS. 1 and 2) having cross-slots 68 stamped therein to form finger portions, with the finger portions being bent down at an angle as shown at 70 so that when a connector prong or pig tail such as the lead 72 is pressed through the same to connect an electrical component to the circuit, the frictional engagement will cause electrical connections and locking of the lead 72 in the socket.

From the above and foregoing description, it will be apparent to those skilled in the art that I have provided a comparatively simple and easily made panel containing an electric circuit, the panel being such that the same need not be soldered or otherwise acted upon in making connections with electrical components that have prongs, pig tails or other rigid connector elements that can be inserted into the locking sockets.

I contemplate that changes and modifications may be made in the exact details shown and I do not wish to be limited in any particular; rather what I desire to secure and protect by Letters Patent of the United States is:

1. In a solderless circuit board for use with electrical components having leads, an insulating panel, conductors formed in the shape of a predetermined electrical circuit, means bonding said conductors to said insulating panel whereby said conductors are supported by said insulating panel and said conductors and insulating panel form an integral unit, a plurality of conductors forming said predetermined circuit including portions on said conductors for connection of electrical components, openings in said insulating panel larger in size than said leads, said openings being arranged at said portions of said conductors, said portions of said conductors being exposed by said openings in a plane transverse to said openings, said exposed portions of said conductors constituting means to attach and electrically connect a lead to said conductors without use of solder, each of said means comprising a central opening in said exposed portion of said conductor smaller in size than the size of said leads, radial slots in said exposed portion of said conductor, and a plurality of finger portions between and adjacent said slots, said finger portions being resilient and having pointed edges adjacent said central opening, said edges being disposed between said slots and being spaced about the periphery of said central opening, said leads being forced into locking position by pushing said leads in one direction into and through said central openings, said edges being adapted to directly engage spaced areas of a lead, said leads being securely gripped and held by locking engagement of the leads with said edges of said resilient finger portions to attach and electrically connect the leads to said conductors without soldering, and said finger portions being bent down from the plane of said conductors in lead gripping position so that said leads are locked against withdrawal in the opposite direction.

2. The solderless circuit board of claim 1 including a face on said insulating panel, said conductors being spaced from said face of said insulating panel, and said components being supported on said face with their leads extending into said openings in said panel for connection to said attaching means.

References Cited in the file of this patent

UNITED STATES PATENTS

| | | |
|---|---|---|
| 1,939,130 | Mills | Dec. 12, 1933 |
| 1,946,889 | Wessel | Feb. 13, 1934 |
| 2,270,166 | Hiensch et al. | Jan. 13, 1942 |
| 2,389,018 | Ballard | Nov. 13, 1945 |
| 2,437,018 | Dodson | Mar. 2, 1948 |
| 2,473,705 | George | June 21, 1949 |
| 2,502,291 | Taylor | Mar. 28, 1950 |
| 2,613,252 | Heibel | Oct. 7, 1952 |
| 2,683,839 | Beck | July 13, 1954 |
| 2,732,532 | Tamis | Jan. 24, 1956 |
| 2,958,064 | Swengel | Oct. 25, 1960 |
| 2,965,812 | Bedford | Dec. 20, 1960 |

FOREIGN PATENTS

| | | |
|---|---|---|
| 940,415 | Germany | Mar. 15, 1956 |